(12) United States Patent
Sabbag et al.

(10) Patent No.: US 9,063,878 B2
(45) Date of Patent: Jun. 23, 2015

(54) METHOD, SYSTEM AND COMPUTER READABLE MEDIUM FOR COPY BACK

(75) Inventors: Erez Sabbag, Kiryat Tivon (IL); Hanan Weingarten, Herzelia (IL)

(73) Assignee: DENSBITS TECHNOLOGIES LTD., Haifa (IL)

( * ) Notice: Subject to any disclaimer, the term of this patent is extended or adjusted under 35 U.S.C. 154(b) by 872 days.

(21) Appl. No.: 13/284,794

(22) Filed: Oct. 28, 2011

(65) Prior Publication Data

US 2012/0110250 A1 May 3, 2012

Related U.S. Application Data

(60) Provisional application No. 61/409,720, filed on Nov. 3, 2010.

(51) Int. Cl.
| | |
|---|---|
| *G06F 12/00* | (2006.01) |
| *G06F 11/10* | (2006.01) |
| *G11C 11/56* | (2006.01) |
| *G11C 16/10* | (2006.01) |

(52) U.S. Cl.
CPC ........ *G06F 11/1072* (2013.01); *G11C 11/5628* (2013.01); *G11C 11/5671* (2013.01); *G11C 16/102* (2013.01)

(58) Field of Classification Search
CPC .................................................. G06F 12/0246
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |
| 5,077,737 A | 12/1991 | Leger et al. | |
| 5,297,153 A | 3/1994 | Baggen et al. | |
| 5,305,276 A | 4/1994 | Uenoyama | |
| 5,592,641 A | 1/1997 | Doyle et al. | |
| 5,623,620 A | 4/1997 | Alexis et al. | |
| 5,640,529 A | 6/1997 | Hasbun | |
| 5,657,332 A | 8/1997 | Auclair et al. | |
| 5,663,901 A | 9/1997 | Harari et al. | |

(Continued)

OTHER PUBLICATIONS

Search Report of PCT Patent Application WO 2009/118720 A3.

(Continued)

*Primary Examiner* — Baboucarr Faal
(74) *Attorney, Agent, or Firm* — Dentons US LLP

(57) ABSTRACT

Systems, computer readable media and methods for updating a flash memory device involve procedures for transferring, from a flash memory device to an external controller, only a portion of a data entity; and determining, by the external controller, based upon the portion of the data entity, whether to complete a copy back operation of the data entity or to correct errors of the data entity. If it is determined to correct errors of the data entity, then the procedure includes (a) completing a transfer of the data entity to the external controller; (b) error correcting the data entity to provide an amended data entity; and (c) writing the amended data entity to the flash memory device. If, however, it is determined to complete the copy back operation then the procedures includes completing the copy back operation of the data entity by transferring the data entity within the flash memory device.

30 Claims, 11 Drawing Sheets

(56) References Cited

U.S. PATENT DOCUMENTS

| | | |
|---|---|---|
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,254,172 B1 * | 8/2012 | Kan .................. 365/185.12 |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |

(56) References Cited

U.S. PATENT DOCUMENTS

| | | |
|---|---|---|
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1* | 4/2011 | Dusija et al. ............... 714/773 |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |

(56) References Cited

U.S. PATENT DOCUMENTS

| | | |
|---|---|---|
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT- 28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

METHOD, SYSTEM AND COMPUTER READABLE MEDIUM FOR COPY BACK

RELATED APPLICATIONS

This application is a NONPROVISIONAL of, claims priority to and incorporates by reference U.S. provisional patent application No. 61/409,720, filed Nov. 3, 2010.

BACKGROUND

Flash memory devices store data in the form of charge in a flash cell. Flash cells can be arranged in arrays such as NAND flash arrays, NOR flash arrays and the like. The flash memory arrays are usually partitioned to erase blocks that may include multiple pages. A flash memory cell has a CMOS transistor with an additional floating metal gate between the substrate and the transistors gate. The charge is stored in the floating gate and is injected to the floating gate during an operation known as programming. The charge may be removed during an operation known as an erase operation.

As the charge in the floating gate may vary contiguously, it is possible to store more than just one bit per flash transistor by using several charge levels to symbolize different sequences of bits.

FIG. 1A demonstrates a voltage level distribution for a 3 bpc (bits per cell) flash memory cell. The voltage level distribution includes eight lobes 101-108. Each lobe represents a 3-bit value.

The voltage level distributions shown in FIG. 1 illustrate non-overlapping lobes, however this is only schematic, and in practical cases the lobes may overlap. The reason for overlapping may be intentional, for obtaining high programming speed, or due to the retention effect. For floating gate devices, an "old" page, may introduce greater overlap between lobes than a new page, since after many program/erase (P/E) cycles there is some deterioration of the cell which affects retention. After a long duration, every lobe may have a larger standard deviation and may have a different mean location. These effects are also known as retention.

The 3 bpc cell includes a most significant bit (MSB), a central significant bit (CSB) and a least significant bit (LSB). A physical page of flash memory device may store three logical pages. This physical page is programmed one logical page after the other.

The programming includes various types of programming such as MSB programming, CSB programming and LSB programming.

MSB programming may include programming some of the cells are programmed to a single lobe and some are left in the erase state. At the end of the programming process only two lobes exist, the erase and the MSB lobe.

The CSB programming may include splitting each of the erase lobe and the MSB lobe into two lobes by further programming pulses, depending on the original state of each cell and the corresponding CSB bit.

The LSB programming may include splitting each of the four lobes to create 8 lobes, overall.

The logical pages are read by applying various types of read operations such as an MSB read (in which an MSB threshold 114 is used), a CSB read (in which two CSB thresholds 112 and 116 are used) and an LSB read (in which four LSB thresholds 111, 113, 115 and 117 are used).

MSB threshold 114 is positioned between lobes 104 and 105. CSB threshold 113 is positioned between lobes 103 and 104. CSB threshold 116 is positioned between lobes 106 and 107. LSB threshold 111 is positioned between lobes 101 and 102. LSB threshold 113 is positioned between lobes 103 and 104. LSB threshold 115 is positioned between lobes 105 and 106. LSB threshold 117 is positioned between lobes 107 and 108.

FIG. 1B shows similar distributions for the case of 2 bpc devices. There are four spaced apart lobes—an erase lobe 121 and three other lobes 122-124.

The logical pages are read by applying various types of read operations such as MSB read (in which a MSB threshold 132 is used) and LSB read (in which two LSB thresholds 131 and 133 are used).

MSB threshold 132 is positioned between lobes 122 and 123. LSB threshold 131 is positioned between lobes 121 and 122. LSB threshold 133 is positioned between lobes 123 and 124.

As mentioned, the lobe distributions are not constant throughout the life of the flash cell and change with retention. With retention, the distribution becomes larger and shifts towards the erase level. The higher the distribution, the larger the shift. This effectively shrinks the effective working window. Both the shrinkage of the window and the fattening of the distributions contribute to the increase in the number of errors after performing a page read.

FIG. 1C illustrates these effects. The upper threshold voltage distribution includes eight spaced apart lobes 141-148 and represents a state of a flash memory page just after the flash memory page has been programmed. The lower threshold voltage distribution includes overlapping lobes 151-158 that are wider than lobes 141-148. These effects become significantly worse as the block P/E cycles increase and as the flash memory technology nodes shrink.

The implications of the retention effect is that using the same set of read-thresholds just following a programming operation and then following retention time may contribute to the number of read errors. In fact, it may be impossible to find a satisfactory set of such read-thresholds. It is therefore crucial to optimally adjust the threshold positions to minimize the number of errors.

Copy-Back Operation

In many cases, it is required to copy a certain section in the flash memory device to a different location in the flash memory device. Most flash memory devices implement a specific command known as copy-back. The copy-back command allows an external controller (that does not belong to the flash memory device) to instruct the flash memory device to internally read a certain page and immediately program the page data to another location in the flash memory device. The flash memory device is usually equipped with a limited functionality controller that can perform memory transfers from and to the flash memory arrays of the flash memory device.

The copy-back operation allows the external controller to perform memory copying in a very efficient manner without the need to stream the data to the external controller and back to the flash memory device This is even more important when the copy-back command is activated on several flash memory devices simultaneously. In that case, without the copy-back command, the interface to the flash memory devices would become a bottle-neck.

However, a copy-back command does not perform error correction. Therefore, it may be that following a copy-back command, the copied data will contain errors. As long as the error correction code (ECC) can correct these errors this may be fine but it may turn out to be a problem in the following two scenarios:

a. The data is being copied from a location that had undergone cycling and retention. As the copy-back command usually uses a default set of thresholds, the copied data may contain errors beyond the capabilities of the ECC to correct them.
b. The data being copied already contains errors from previous copy-back commands. Thus, errors may accumulate until the codewords are no longer correctable.

SUMMARY OF THE INVENTION

In an embodiment of the present invention, a method may be provided and may include (i) transferring, from a flash memory device to an external controller, a portion of a data entity; (ii) determining, by the external controller, based upon the portion of the data entity, whether to complete a copy back operation of the data entity or to correct errors of the data entity. If it is determined to correct errors of the data entity, then the determining is followed by (a.1) completing a transfer of the data entity to the external controller; (a.2) error correcting the data entity to provide an amended data entity; and (a.3) writing the amended data entity to the flash memory device. If it is determined to complete the copy back operation then the determining is followed by completing the copy back operation of the data entity by transferring the data entity within the flash memory device.

The transferring may include transferring the portion of the data entity without transferring the data entity in its entirety. The portion of the data entity may be a fraction of the data entity. For example, the portion can be less than one percent of the data entity, can be a few percent, e.g., ten percent, twenty percent, thirty percent or any other percentage of same. The size of the portion can change over time. Larger portions may provide more reliable determinations but their transfer to the host computer can be longer.

The method may include initiating the copy back operation after a completion of the determining. This may be referred to as a serial manner of operation.

The method may include initiating the copy back operation before a completion of the determining step. This may be referred to as a parallel manner of operation. This can save time as the copy back operation can be time consuming and initiating the write back before the completion of the determining step can speed up the process.

The method may include completing a transfer of a fraction of the data entity to a first flash memory fraction before the completion of the determining step; and declaring the first flash memory fraction as storing invalid data if it is determined to correct errors of the data entity.

The method may include completing a transfer of a fraction of the data entity to a first flash memory fraction before the completion of the determining step; and writing the amended data entity to a second flash memory fraction that differs from the first flash memory fraction.

The transferring, from the flash memory device to the external controller, of the portion of a data entity may include reading the portion of the data entity using a first set of read thresholds; and the completing of the transfer of the data entity to the external controller may include reading the data entity using a second set of read thresholds that differs from the first set of read thresholds.

The method may include soft decoding the data entity by the external controller, if it is determined to correct errors of the data entity.

The determining step may include decoding multiple subsets of the portion of the data entity by at least one error correction code to provide multiple results; and determining whether to complete the copy back operation or to correct errors of the data entity based on the multiple results.

The determining step may include applying an error detection code or an error correction code that differ from an error correction code applied by the external controller during the error correcting of the data entity.

The method may include transferring the data entity to a flash memory space within the flash memory device; and prioritizing the flash memory space for wear-leveling. The prioritizing compensates for errors that may have been introduced during the copy back operation.

The determining step may include performing a modulo test of the portion of the data entity.

The data entity may be stored at a flash memory space and the method may include invoking the transferring and the determining operations based on at least one parameter out of (a) a number of erase cycles that the flash memory space has undergone; (b) an age of the flash memory space; and (c) errors detected in reading attempts of similar flash memory spaces.

The determining step may be responsive to a load level of the flash memory device.

The portion of the data entity may include redundancy bits that represent a number of copy back operations that were applied on the data entity after a last error correction operation was applied on the data entity; and the determining is responsive to the number.

The method may include updating the number in response to the determining.

The method may include storing the redundancy bits within a register of the flash memory device; receiving from the external controller an updated value of the redundancy bits that reflects an update of the number; and programming the redundancy bits to a flash memory space.

Additionally, embodiments of the invention may include a method for updating a flash memory device. The method may include determining, by the flash memory device, based upon at least a portion of a data entity, whether to complete a copy back operation of the data entity or to correct errors of the data entity. If a determination is made to correct errors of the data entity, completing a transfer of the data entity to an external controller, error correcting the data entity to provide an amended data entity, and writing the amended data entity to the flash memory device. If a determination is made to complete the copy back operation, completing the copy back operation of the data entity by transferring the data entity within the flash memory device.

The method may include notifying the external controller about the determination.

The method may include completing a transfer of a fraction of the data entity to a first flash memory fraction before a completion of the determining step; and declaring the first flash memory fraction as storing invalid data if determining to correct errors of the data entity.

Further embodiments of the invention include a computer readable medium that is non-transitory and may store instructions for performing the above-described methods and any steps thereof, including any combinations of same.

For example, the computer readable medium may store instructions for execution by one or more processors or similar devices, which instructions, when executed, result in, cause or facilitate transferring, from a flash memory device to an external controller, a portion of a data entity; determining, by the external controller, based upon the portion of the data entity, whether to complete a copy back operation of the data entity or to correct errors of the data entity; if it is determined to correct errors of the data entity, completing a transfer of the data entity to the external controller, error correcting the data entity to provide an amended data entity, and writing the amended data entity to the flash memory device; and if it is determined to complete the copy back operation then completing the copy back operation of the data entity by transferring the data entity within the flash memory device.

By way of further example, the computer readable medium may store instructions for determining, by the flash memory device, based upon at least a portion of a data entity, whether to complete a copy back operation of the data entity or to correct errors of the data entity; if it is determined to correct errors of the data entity completing a transfer of the data entity to an external controller, error correcting the data entity to provide an amended data entity, and writing the amended data entity to the flash memory device; if it is determined to complete the copy back operation, completing the copy back operation of the data entity by transferring the data entity within the flash memory device.

Additional embodiments of the invention include a system arranged to execute any or all of the methods described above, including any stages and any combinations of same.

For example, the system may include a flash memory device and an external controller. The external controller may be arranged to read a portion of a data entity from the flash memory device; and determine, based upon the portion of the data entity, whether to complete a copy back operation of the data entity or to correct errors of the data entity. If it is determined to correct errors of the data entity, the external controller may be arranged to complete a read operation of the data entity from the flash memory device; error correct the data entity to provide an amended data entity; and write the amended data entity to the flash memory device. If it is determined to complete the copy back operation, the system may be arranged to complete the copy back operation of the data entity by transferring the data entity within the flash memory device.

In another example, a system may be provided and may include a flash memory device and an external controller. The flash memory device may be arranged to determine, based upon at least a portion of a data entity, whether to complete a copy back operation of the data entity or to correct errors of the data entity. If the flash memory device determines to correct errors of the data entity, the flash memory device or the external controller may be arranged to complete a transfer of the data entity to the external controller. The external controller may be arranged to error correct the data entity to provide an amended data entity and to write the amended data entity to the flash memory device. If the flash memory device determines to complete the copy back operation then the flash memory device may be arranged to complete the copy back operation of the data entity by transferring the data entity within the flash memory device.

According to still another embodiment of the invention, a method for copy-back may be provided and may include transferring to an evaluation circuit only a portion of data that is destined to be copied-back; determining, by the evaluation circuit, whether the data should be copied-back or should be error corrected; copying-back the data to the flash memory device, if the evaluation circuit determines that the data should be copied-back, wherein the copying-back comprises copying the data within the flash memory device; and error correcting the data to provide amended data and writing the amended data to the flash memory device, if the evaluation circuit determines that the data should be error corrected.

The method may include initializing a copying-back of the data to the flash memory device before a completion of the determination by the evaluation circuit; completing the copying-back if it is determined, by the evaluation circuit, that the data should be copied-back; and stopping the copy-back of the data to the flash memory device if it is determined, by the evaluation circuit, that the data should be error corrected.

The evaluation circuit may belong to the flash memory device, or be external to the flash memory device and may be coupled to the flash memory device.

The method may include prioritizing a wear-level operation of a destination block of the flash memory device that stored the copied-back data.

The method may include scheduling an execution of a copy-back based on at least one parameter of a program erase cycle count of a destination block that stores the copied-back data, a time of execution of the copy-back of the data to the destination block, and an estimation of a reliability of data that was copied-back to the destination block.

The method may include determining by the evaluation circuit whether the data should be copied-back or should be error corrected based on a reliability criterion that is responsive to a load imposed on the flash memory device.

The method may include erasing an original version of the data if it is determined by the evaluation circuit that the data should be copied-back.

In yet a further embodiment of the invention, a system may be provided and may include: an evaluation circuit arranged to receive only a portion of data that is destined to be copied-back and to determine whether the entire data should be copied-back or should be error corrected; an internal controller arranged to copy-back the data to a flash memory device if the evaluation circuit determines that the data should be copied-back, the internal controller arranged to copy the data within the flash memory device; an error correction circuit arranged to error correct the data to provide amended data if the evaluation circuit determines that the data should be error corrected; and an external controller that is arranged to control a writing of the amended data to the flash memory device.

The evaluation circuit can be included in the external controller or in the flash memory device.

The internal controller may be arranged to initialize a copying-back of the data to the flash memory device before completion of the determining step by the evaluation circuit; complete the copying-back if the determination by the evaluation circuit is that the data should be copied-back; and stop the copying-back of the data to the flash memory device if it is determined by the evaluation circuit that the data should be error corrected.

The system may include a management circuit that is arranged to prioritize a ware-level operation of a destination block of the flash memory device that stores the copied-back data.

The system may include a management circuit that is arranged to schedule execution of a copy-back based on at least one parameter of a program erase cycle count of a destination block that stores the copied-back data, a time of execution of the copying-back of the data to the destination block, and an estimation of a reliability of data that was copied-back to the destination block.

The evaluation circuit may be arranged to determine whether the data should be copied-back or should be error corrected based on a reliability criterion that is responsive to a load imposed on the flash memory device.

The system may include a management circuit that is arranged to erase an original version of the data if the determination by the evaluation circuit is that the data should be copied-back.

According to still another embodiment of the invention, a non-transitory computer readable medium may be provided and may store instructions for: transferring to an evaluation circuit at least a portion of data that is destined to be copied-back; determining by the evaluation circuit whether the data should be copied-back or should be error corrected; copying-back the data to the flash memory device if the evaluation circuit determines that the data should be copied-back, the copying-back may include copying the data within the flash memory device; and error correcting the data to provide amended data and writing the amended data to the flash memory device if the evaluation circuit determines that the data should be error corrected.

The non-transitory computer readable medium may store instructions for initializing a copying-back of data to the flash memory device before completion of the determination by the evaluation circuit; completing the copying-back if the determination by the evaluation circuit is that the data should be copied-back; and stopping the copy-back of the data to the flash memory device if the determination by the evaluation circuit is that the data should be error corrected.

The non-transitory computer readable medium may store instructions for prioritizing a wear-level operation of a destination block of the flash memory device that stores the copied-back data.

The non-transitory computer readable medium may store instructions for scheduling execution of a copy-back based on at least one parameter of a program erase cycle count of a destination block that stores the copied-back data, a time of execution of the copy-back of the data to the destination block, and an estimation of a reliability of data that was copied-back to the destination block.

The non-transitory computer readable medium may store instructions for determining, by the evaluation circuit, whether the data should be copied-back or should be error corrected based on a reliability criterion that is responsive to a load imposed on the flash memory device.

The non-transitory computer readable medium may store instructions for erasing an original version of the data if the determination by the evaluation circuit is that the data should be copied-back.

BRIEF DESCRIPTION OF THE DRAWINGS

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

For simplicity of explanation it is assumed that a data entity has a size of a page. It should be appreciated, however, that the present methods, systems and computer readable media can be applied mutatis mutandis to data entities that differ than a page.

Copy-Back Methods

In the following text various copy-back methods are illustrated. It is noted that various combination of these methods and, additionally or alternatively, of stages of these methods, can be provided.

A flash memory page can store data that may be referred to as page data. A portion of the flash memory page may store a portion of the page data.

Figure 1A:
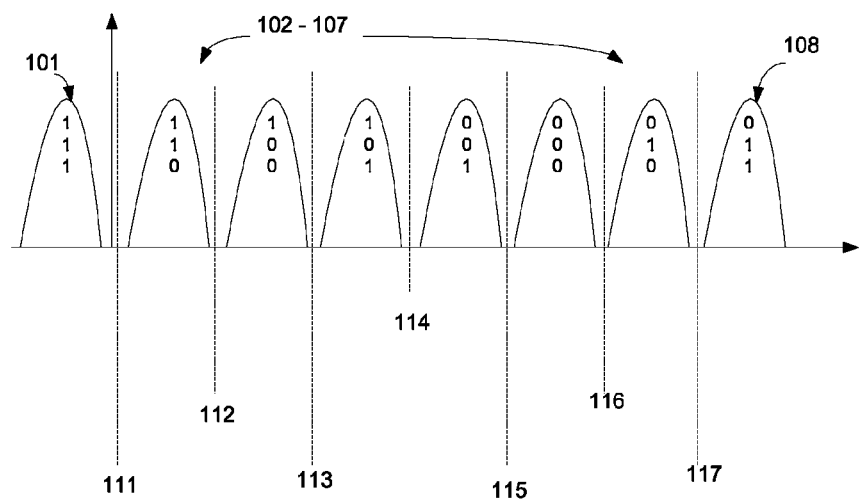
FIGS. 1A-1C illustrate prior art threshold voltage distributions and read thresholds.
Figure 1B:
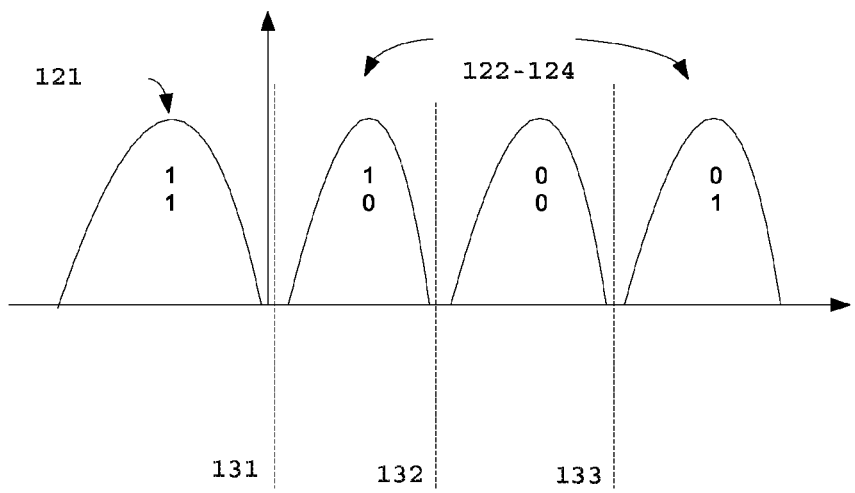
Figure 1C:
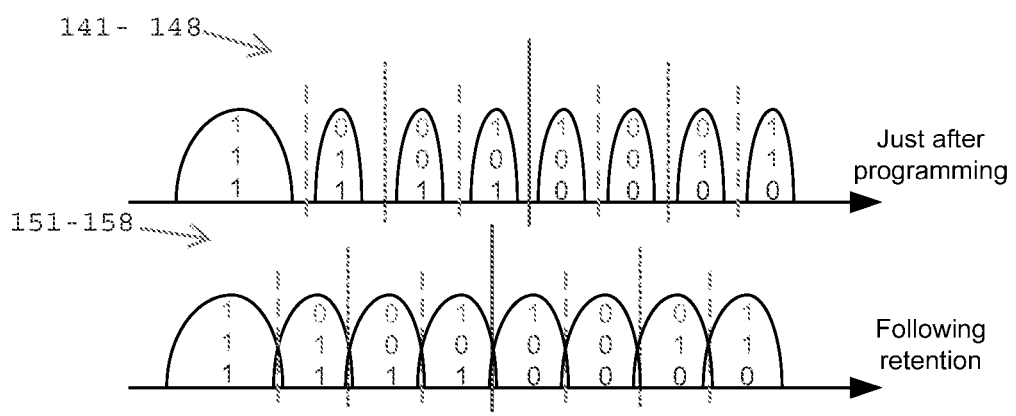
Figure 2:
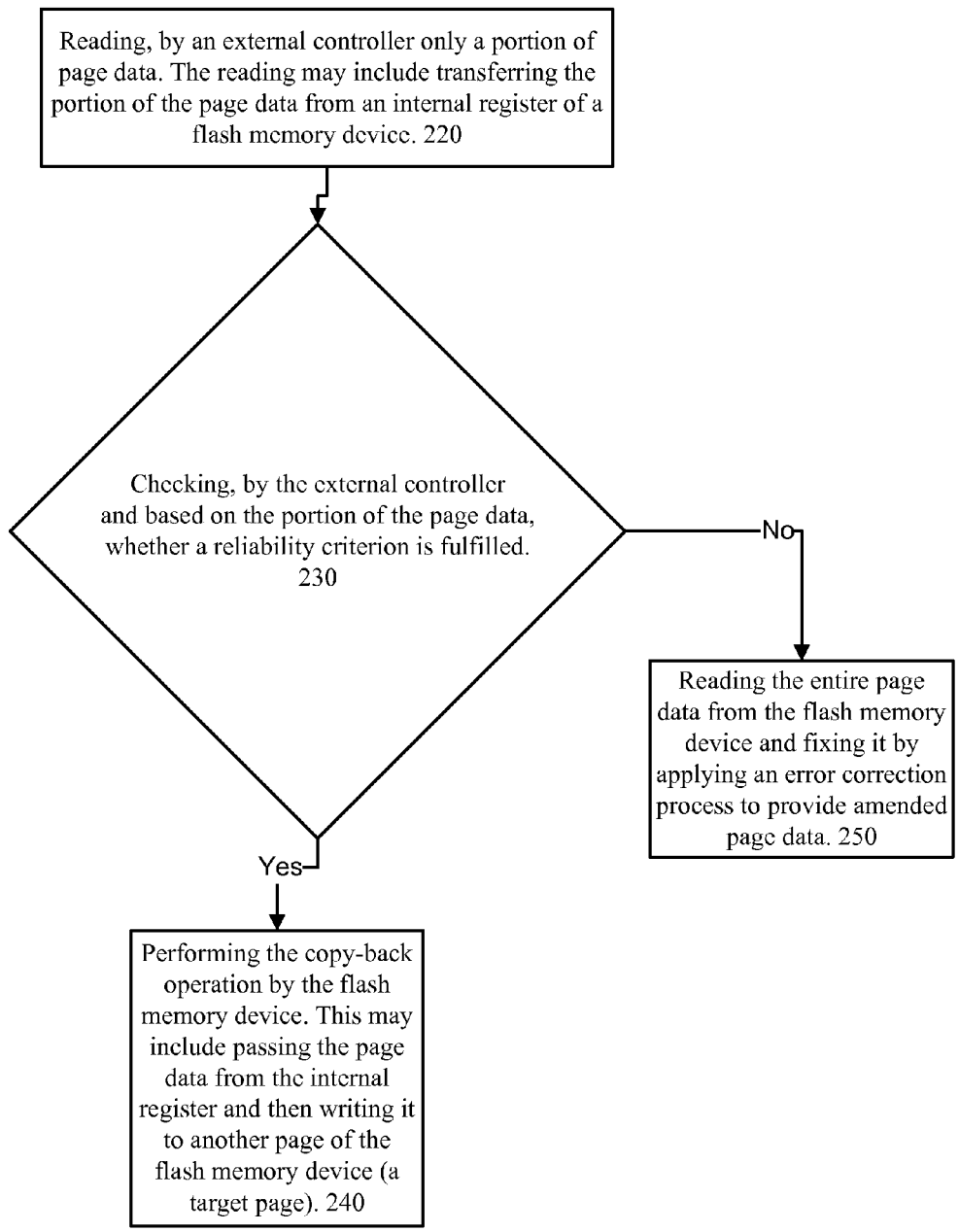
FIGS. 2-3, 4A and 4B illustrate methods according to an embodiment of the invention.

FIG. 2 illustrates a method 200 according to an embodiment of the invention. In method 200 an external controller controls the copy-back operation.

Method 200 may start by stage 220 of reading, by the external controller (in communication with a flash memory device) only a portion of page data. The page can be regarded as a source page.

The reading may include transferring the portion of the page data from an internal register of the flash memory device to the external controller.

Stage 220 may be followed by stage 230 of checking, by the external controller and based on the portion of the page data, whether a reliability criterion is fulfilled.

Stage 230 can be viewed as including determining whether to perform the copy-back operation or to perform error correction of the content of the page.

If the reliability criterion is fulfilled or satisfied, then stage 230 can be followed by stage 240 of performing the copy-back operation by the flash memory device. This may include passing the page data from the internal register and then writing it to another page of the flash memory device (a target page).

If the portion of the page data is small in relation to the entire page data, this can require only a short transfer time and may shorten the determination process of the external controller.

If the reliability criterion fails or is not satisfied, stage 230 may be followed by stage 250 of reading the entire page data from the flash memory device (if not already present at external controller) and fixing it by applying an error correction process to provide amended page data.

According to an embodiment of the invention the read operation executed during stage 250 is done by using different read parameter—such as different read thresholds or using soft decoding instead of hard decoding. Thus, multiple read attempts (using the same or different read parameters) can be fulfilled during stage 250.

Stage 250 may include writing back the amended page data to the flash memory device, but to another flash memory page—a page that differs from the source page.

It is noted that the features required by the above method are easily supported by current flash memory devices using the standard read command, program command and copy-back command.

Figure 3:
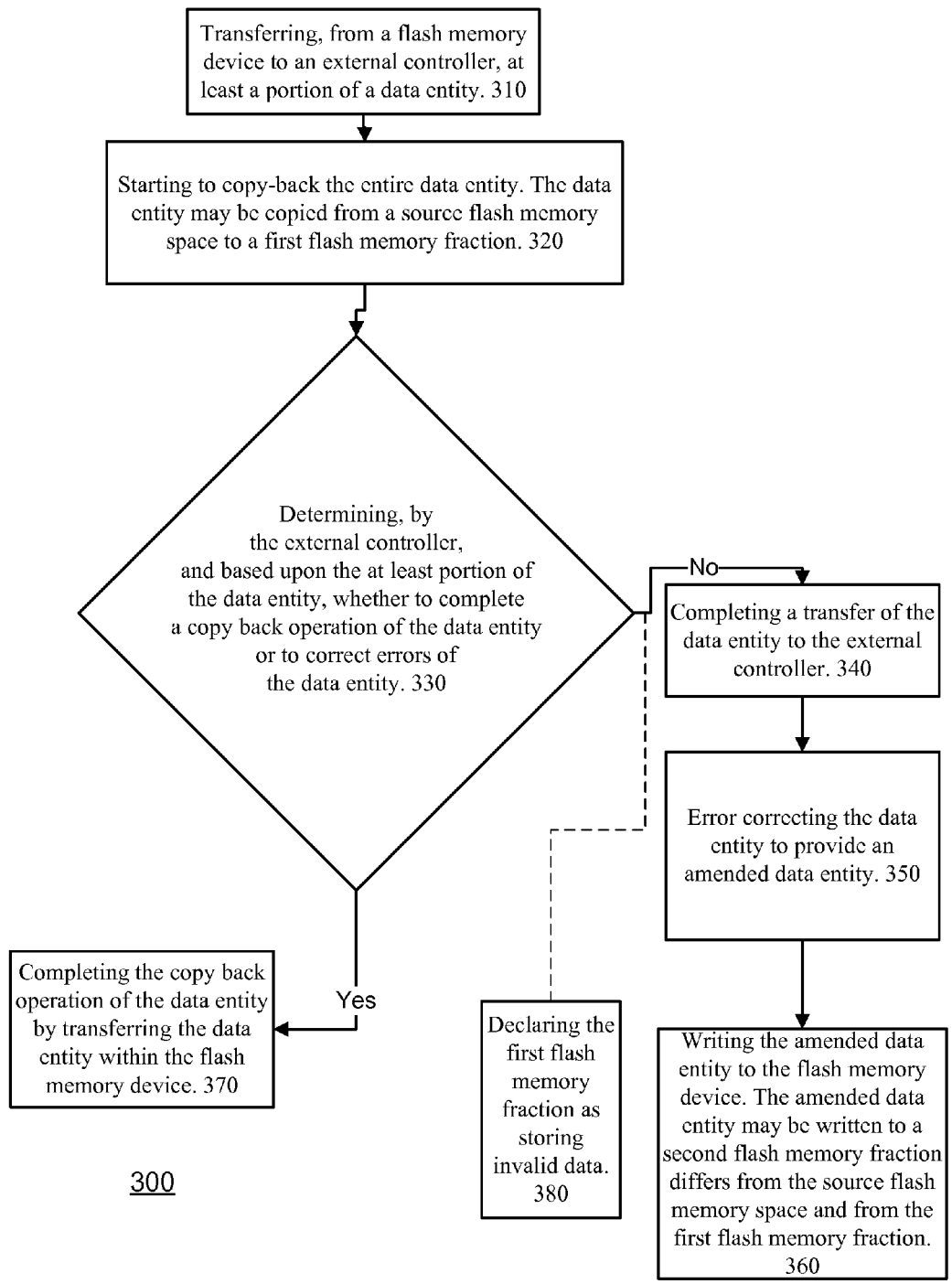

FIG. 3 illustrates method 300 according to an embodiment of the invention.

In this case, an internal program operation (write-back) is initiated before the external controller finishes checking the reliability criterion. This method may include reading the entire data entity or a portion of the data entity and sending it to the external controller for reliability criterion evaluation.

Method 300 may start by stages 310 and 320.

Stage 310 may include transferring, from a flash memory device to an external controller, at least a portion of a data entity.

Stage 320 may include starting to copy-back the entire data entity. The data entity may be copied from a source flash memory space to a first flash memory fraction.

Stage 310 is expected to be completed before the completion of the copying-back of the entire data entity.

Stage 320 is followed by stage 330 of determining, by the external controller, and based upon the at least portion of the data entity, whether to complete a copy back operation of the data entity or to correct errors of the data entity.

If it is determined (during stage 330) to correct errors of the data entity then stage 330 is followed by stage 340 of completing a transfer of the data entity to the external controller; stage 350 of error correcting the data entity to provide an amended data entity; and stage 360 of writing the amended data entity to the flash memory device. The amended data entity may be written to a second flash memory fraction differs from the source flash memory space and from the first flash memory fraction.

If it is determined (during stage 330) to complete the copy back operation then stage 340 is followed by stage 370 of completing the copy back operation of the data entity by transferring the data entity within the flash memory device.

Stage 310 may include transferring only the portion of the data entity, without transferring the data entity in its entirety.

Stage 320 may start during the execution of stage 310.

If it is determined (during stage 330) to correct errors of the data entity then stage 330 may also be followed by stage 380 of declaring the first flash memory fraction as storing invalid data.

FIG. 3 illustrates the initiation of the write-back operation as preceding the initiation of the transfer of the page data (or a portion thereof) to the external controller. It is noted that other timing relationships can be applied, as long as the copy-back starts before the completion of the reliability criterion check.

The page data (or part of it) may be output to the external controller in parallel to the copy-back operation. The gain here is that the data output and reliability criteria check occur concurrently to the page programming operation (the copy-back) and thus save the data transfer time and the external controller processing time.

This may require a special operation mode of the flash memory device. If the reliability criteria check fails (if the external controller determines that there is a need to error correct the page), then the page data is read and decoded. It is noted that one or more read parameters used for reading the entire page data (after the reliability criteria was found to be violated) may differ from one or more read parameters used during the initial transfer of the page data (or a portion thereof) being checked.

The amended page data may be programmed to a new page that differs from the source page and the target page. The target page (that started to receive the page data) may be marked as irrelevant. Marking the target page as irrelevant is supported by most memory management systems in external controllers of most applications.

It is noted that the external controller and the flash memory device may play different roles in any of the above-described methods. Thus, various stages of methods 200 and 300 may be altered according to the different roles of the external controller and the flash memory device. Non-limiting examples of such different roles are provided in FIGS. 4A, 4B and 5-7, discussed below.

Figure 4A:
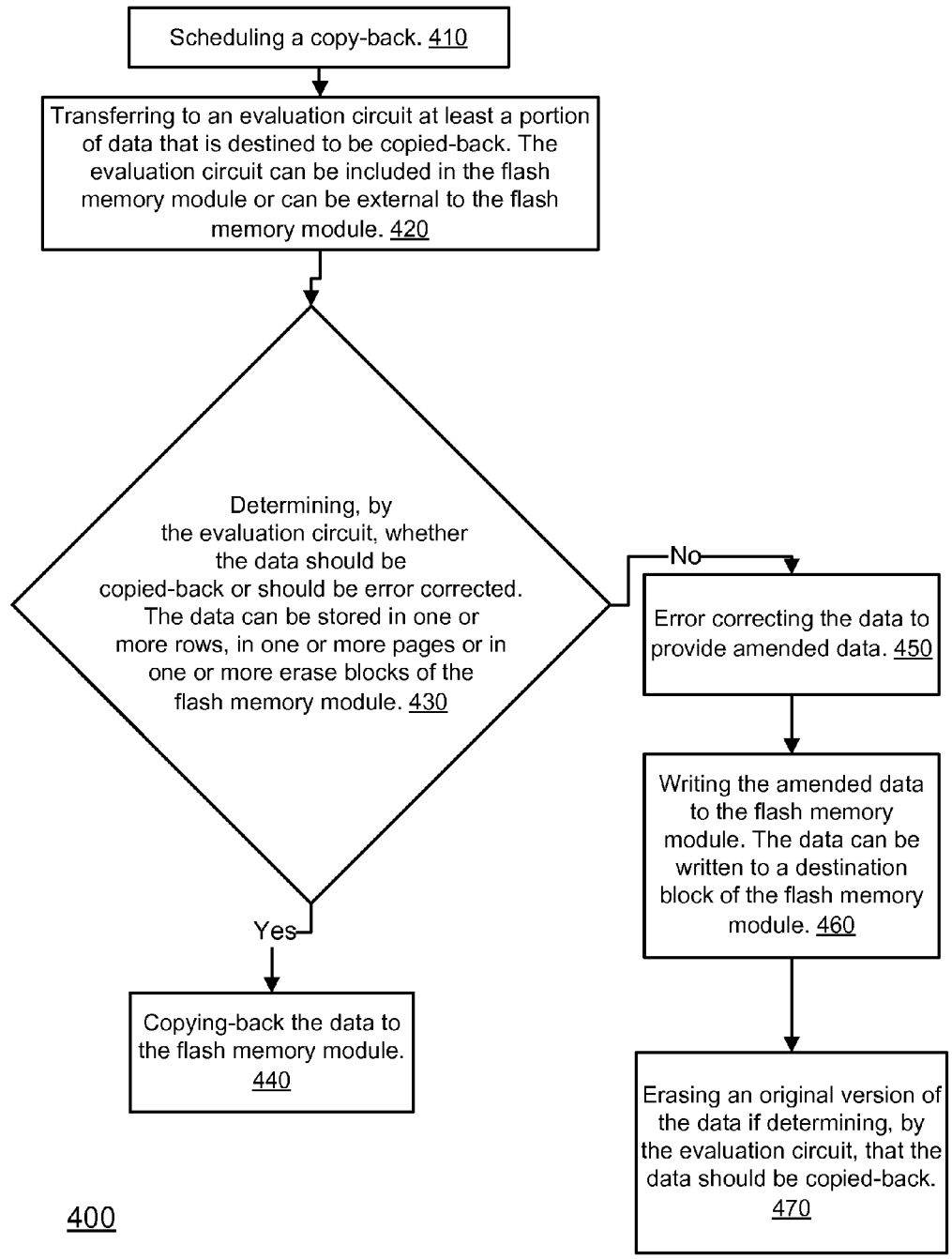

FIG. 4A illustrates a method 400 for copying-back, according to an embodiment of the invention.

Method 400 can start by stage 410 of scheduling a copy-back. The scheduling can be responsive to previous copy-back attempts.

For example, the scheduling can be responsive to one or more parameters such as but not limited to: (a) a program erase cycle count of a destination block that stores copied-back data, (b) a time of execution of the copy-back of the data to the destination block, and (c) an estimation of a reliability of data that was copied-back to the destination block.

Stage 410 may be followed by stage 420 of transferring, to an evaluation circuit, only a portion of data that is destined to be copied-back. The evaluation circuit can be included in the flash memory device or can be external to the flash memory device. For example, the evaluation circuit can be included in an external controller.

Stage 420 is followed by stage 430 of determining, by the evaluation circuit, whether the data should be copied-back or should be error corrected. The data can be stored in one or more rows, in one or more pages or in one or more erase blocks of the flash memory device. The data can be represented by one or more logical pages.

The determination of stage 430 can be responsive to an evaluated reliability (error rate) of the portion of the data (or of the portion of data that is transmitted during stage 420).

A copy-back may be allowed if the reliability of the data is above a predefined threshold. The threshold can be set so that the copy-back will not corrupt the data and that the data can be error corrected by an error correction circuit of known error correction capabilities. Such an error correction circuit may be used during stage 450.

Stage 430 may include determining, by the evaluation circuit, whether the data should be copied-back or should be error corrected, based on a reliability criterion that is responsive to a load imposed on the flash memory device. If the flash memory device is heavily loaded (undergoes extensive read and programming cycles) the copy-back can be allowed using a lower reliability threshold.

Stage 430 may include any of the following schemes or a combination thereof:
  a. Decoding the data and counting the number of errors and comparing the number of errors to a predefined error threshold. If the error threshold is exceeded, a copy-back should not be executed. The predefined error threshold can be set to a level of errors that can not be amended by an error correction code applied during stage 450. It is noted that the predefined error threshold can be set to a lower level.
  b. Applying codes that may be tailored for reliability correction.
  c. Applying codes that can have error correction capabilities.
  d. Applying codes that are capable only for error detection or have lower error correction capabilities than those applied during stage 430. These codes may be such that they have poor error correction capabilities or none at all but allow fast detection of poor reliability from a small section on the page.
  e. Applying threshold determination processes that evaluate the read thresholds and prevent a copy-back if the read thresholds are not accurate enough. This may include performing multiple reads of the data and comparing the read results. If the read thresholds are well positioned and are positioned far from the programmed lobes, substantially the same results are obtained. On the other hand, if the read thresholds are not reliable or the programmed lobes are very wide, many variations will appear between the results. The number of mismatches can be counted by applying an XOR operation and can be compared to a tolerable mismatch.

f. Applying error correction codes on a small fraction of the data to obtain scores and processing the scores. For example, counting the number of small fractions that included errors and comparing the number to an allowed threshold.

g. Applying a modulo code. The modulo code may add L−1 redundant bits which ensure that the number of "1"s in each subset is equal to 0 modulo L. This is easily done by adding (L−(number of "1"s in original subset modulo L)) "1"s in the redundancy. During the reliability check a score is calculated per subset of bits and may be defined by:
  i. x=number of "1"s in subset including redundancy modulo L
  ii. subset score=x if x<=L/2 or x−L if x>L/2
  iii. The overall score may then be calculated as the absolute value of the sum of all subset scores OR the sum of the absolute value of the subset scores. The higher the score the poorer the reliability.

h. Defining a metric on short error correction codes and summing these up. For example, the metric may be defined as a function of the number of errors that were detected and whether the codeword was decodable. This may make use of parts of the error correction system which may be made up of many smaller ECC components.

i. Determining that the data is reliable based on the number of copy operations that were executed after the last error correction decoding. A number of redundancy bits can be allocated per page to store a counter that is indicative of the number of copy operations a page has underwent without being decoded. Every time the page is being copied using a copy-back process, the counter is increased by 1. The reliability checker simply checks this counter against some threshold and if it is above the threshold the data will be decoded and the counter will be reset. 8-bit binary counter fields can be used although other sized counter fields can be used.

Stage 430 may include using a reliability threshold. The reliability threshold can be determined based on the load of the system load: when the system is working under high load (high performance regime), the reliability threshold can be loosened or relaxed, i.e., the copy-back can be issued even if there are a relatively high number of errors. However, these blocks should be highly prioritized in the wear-leveling method. Under low system load, the threshold value can be tightened, so that only a very low number of errors is allowed during copy-back process.

If the evaluation circuit determines the copy-back should be performed, stage 430 is followed by stage 440 of copying-back the data to the flash memory device. As indicated above, the copy-back may include copying the data within the flash memory device—without using external data buses or interfaces. The data is copied to a destination block of the flash memory device.

If the evaluation circuit determines that error correction is needed, then stage 430 is followed by stage 450 of error correcting the data to provide amended data.

Stage 450 is followed by stage 460 of writing the amended data to the flash memory device. The data can be written to a destination block of the flash memory device.

Although FIG. 4A illustrates method 400 as including sequential stages, it is noted that these stages can be executed out of order, in an overlapping or in partially overlapping manner, and the like.

By way of non-limiting example, the copy-back can be time consuming (in relation to the determination of stage 430) and can be initiated before the determination of stage 430 is completed.

For example, stage 440 of copying-back the data to the flash memory device can start before a completion of the determining step 430 by the evaluation circuit.

If it is determined, by the evaluation circuit, that the data should be copied-back then the copy-back is completed. Otherwise, the copy-back can be stopped and amended data will be written to the flash memory device. If the stopped copy-back included copying-back the data to a certain block of the flash memory device then the modified data can be written to another block that is regarded as the destination block of the flash module.

Stage 440 may be followed by prioritizing a wear-level operation of a destination block of the flash memory device that stores the copied-back data. The prioritization may shorten the time period that the destination block stores the copied-back data and reduces the chances that the error prone copy-backed data will be stored without being refreshed for long periods after being copied-back.

The prioritizing can include increasing an effective cycle count. This may ensure that the block will be re-written with high probability before the block exceeds its life span.

In many cases, data stored in many pages is copied from one block to another. This raises the possibility to postpone the copy-back reliability criteria check process and maintain the original block. When the original block is to be erased, the method can perform the copy-back. If the check passes, the original data is erased. Otherwise, the original data can be copied-back or an error correction decoding can be applied on the original data. Accordingly, method 400 can include stage 470 of erasing an original version of the data if it is determined, by the evaluation circuit, that the data should be copied-back.

Figure 5:
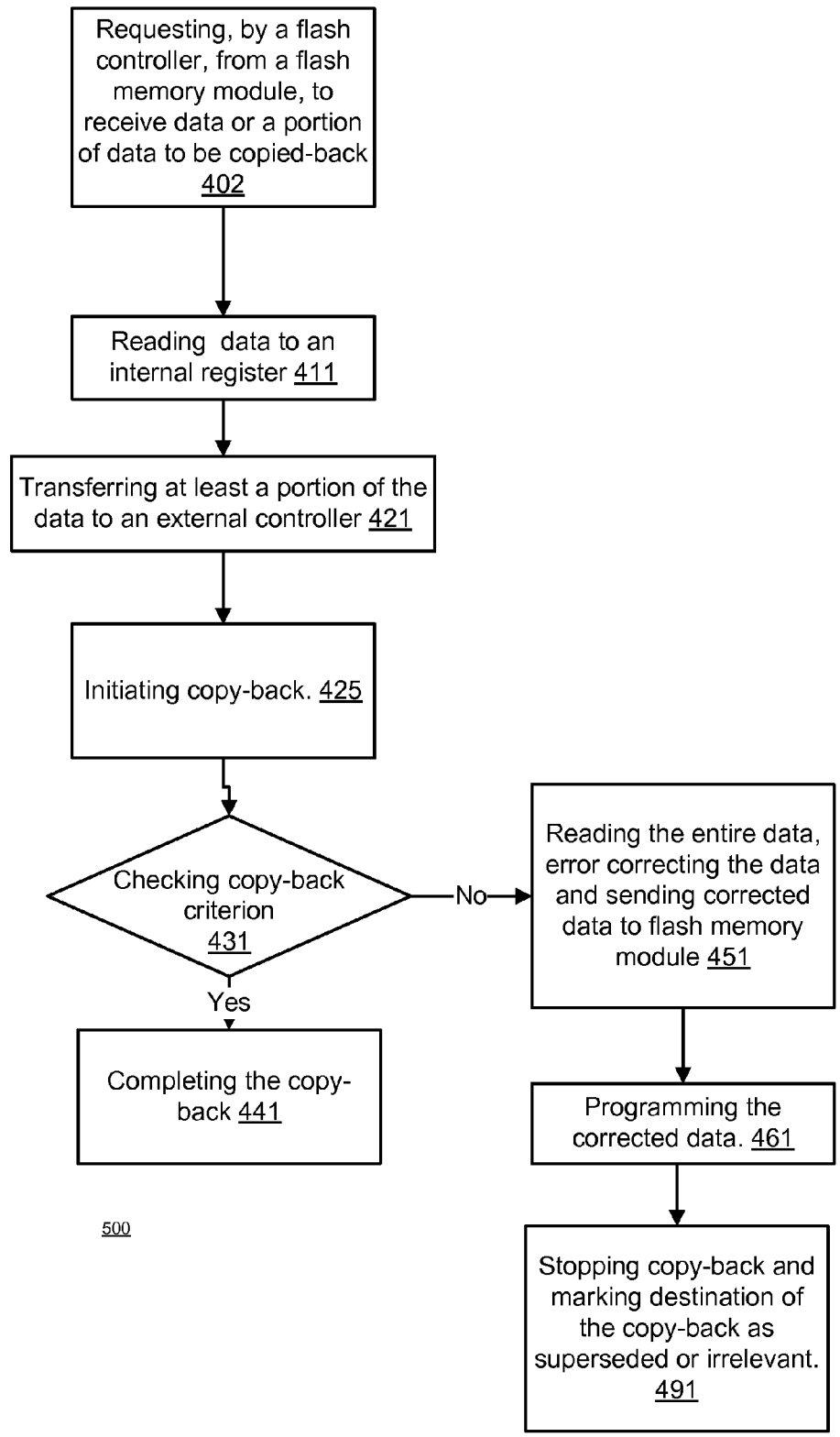
FIGS. 5-7 illustrate methods according to various embodiments of the invention.
Figure 6:
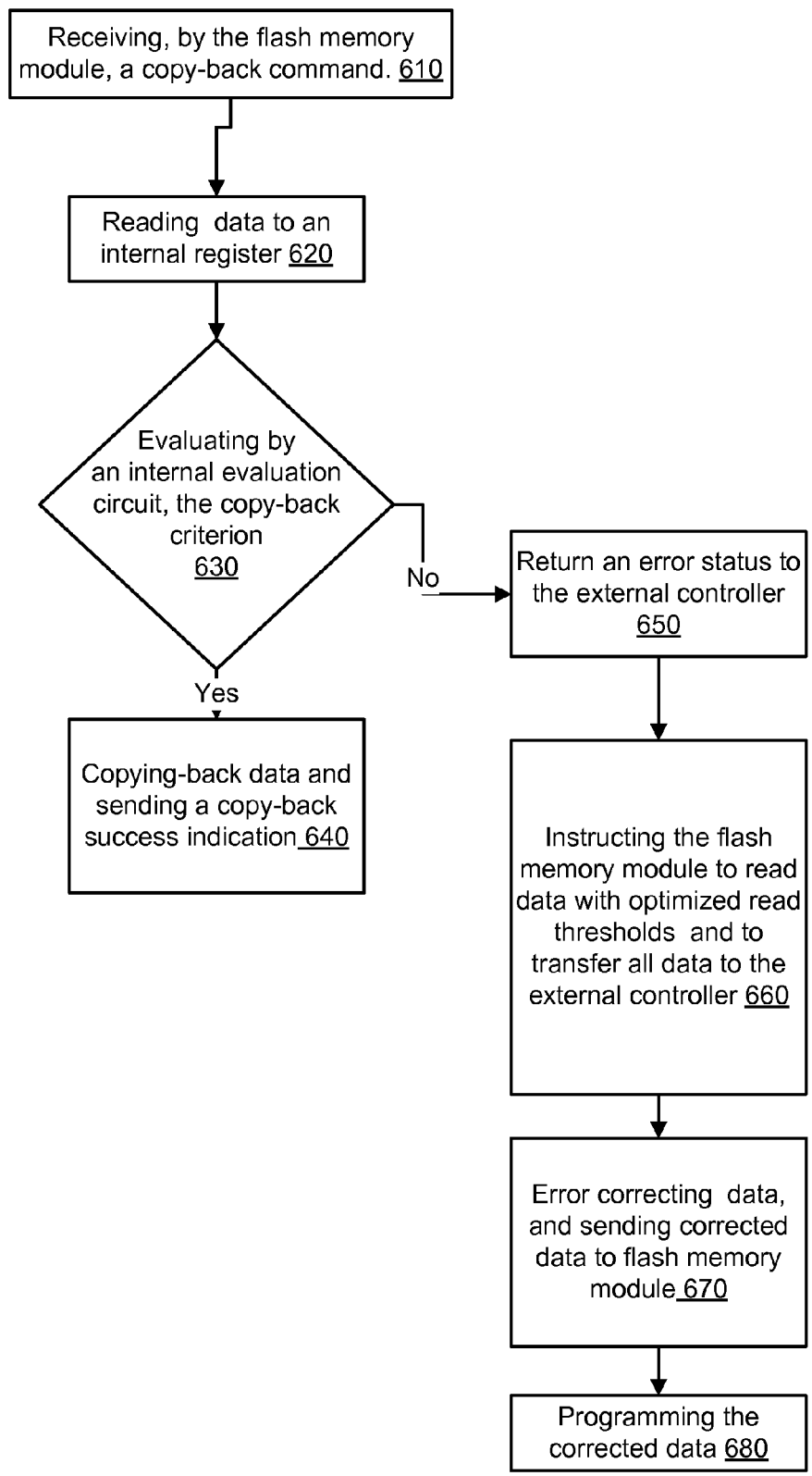
Figure 7:
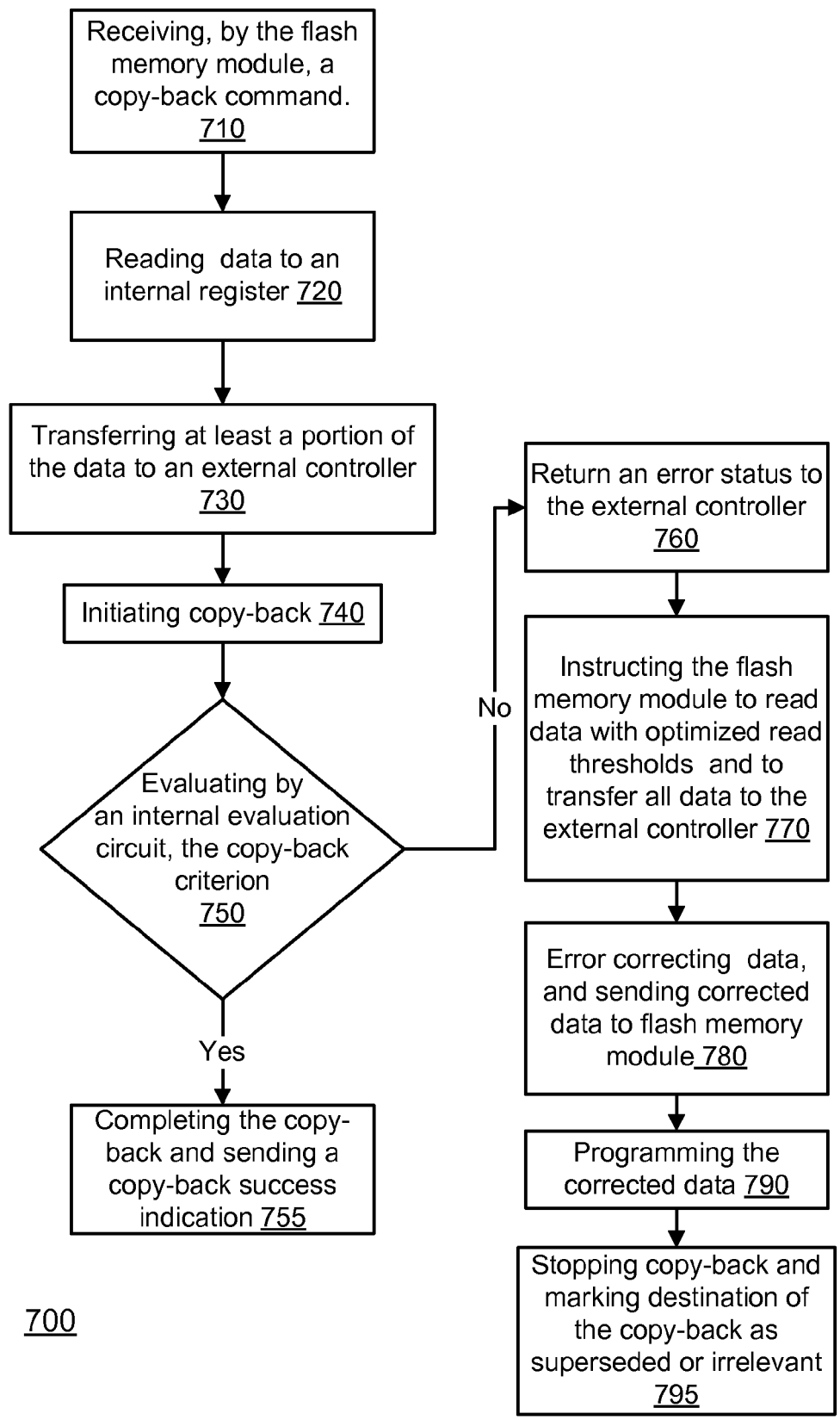

For simplicity of explanation stages 460 and 470 are not included in FIGS. 5-7 although each of methods 500, 600 and 700 can include at least one of these stages.

Figure 4B:
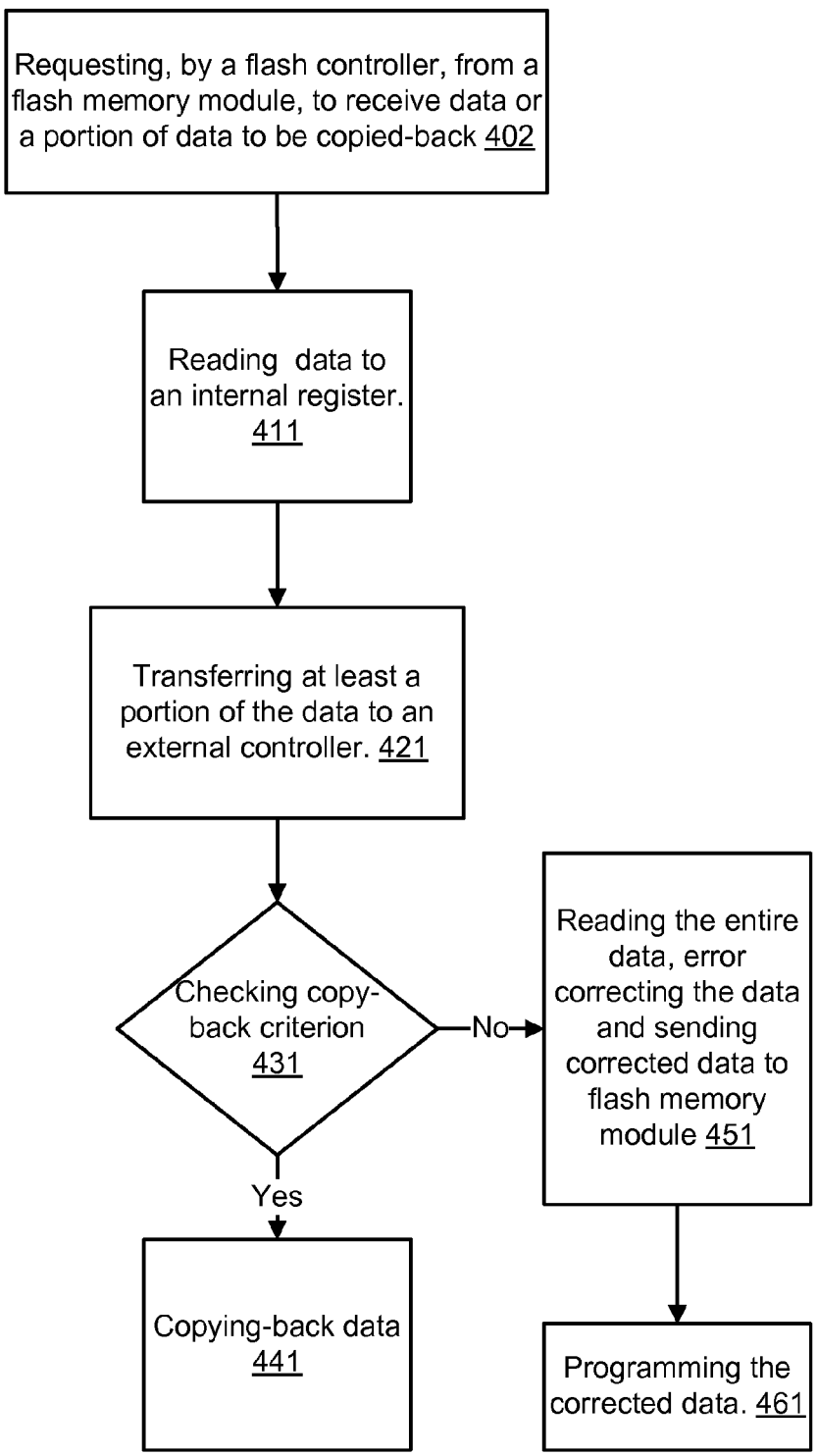

FIG. 4B illustrates a method 401 according to an embodiment of the invention.

The method 401 of FIG. 4B is controlled by an external (host) controller.

Method 401 starts by stage 402 of requesting, by a flash controller, from a flash memory device, to receive data or a portion of data to be copied-back. The data can represent one or more logical pages or a portion thereof. For simplicity of explanation it is assumed that a portion of the data is requested.

Stage 402 is followed by stage 411 of storing the portion of the data in an internal register of the flash memory device. It is noted that the flash memory device can perform another operation that will facilitate the transmission of the portion to the external controller.

Stage 411 is followed by stage 421 of reading, by the external controller, the portion of the data (i.e., transferring the portion of the data to the external controller).

Some gain can be obtained if the amount of data (portion of the data) output to the external controller during stage 411 is small, requiring only a short transfer time and fast processing by the external controller. Nevertheless, the size of the portion should be big enough to allow a reliable estimation of the reliability of the portion. Thus, the size of the portion can provide a trade-off between these requirements.

Stage 421 is followed by stage 431 of checking a copy-back criterion (or copy-back criteria). The checking includes evaluating the reliability of the portion of the data—the number of errors that are expected to be included in the data either before the copy-back operation or when such a copy-back operation is completed.

If the reliability criterion is fulfilled, stage 431 is followed by stage 441 of performing a copy-back. Stage 441 may include issuing a copy-back or programming the portion of the logical data already present in the internal register.

If the reliability criterion fails, stage 431 is followed by stage 451 of reading the entire data (if it was not already read during stage 421) from the flash memory device and fixing the data by applying error correction decoding to provide amended data. Stage 451 also includes sending the amended data to the flash memory device.

Stage 451 may include reading the data from the flash memory device using optimized read thresholds, and additionally or alternatively using soft decoding Stage 451 is followed by stage 461 of programming the amended data to the flash memory device.

FIG. 5 illustrates a method 500 according to an embodiment of the invention.

Method 500 differs from method 400 of FIG. 4B by including stages 425 and 491.

Method 500 starts by stage 402 of requesting, by a flash controller, from a flash memory device, to receive at least a portion of a data. For simplicity of explanation it is assumed that a portion of the data is requested. It is noted that the data that is being read, copy-back or amended can be a logical page but that the method can be applied mutatis mutandis data of other sizes (more than one logical page, a portion of a logical page, a data of a an erase block and the like).

Stage 402 is followed by stage 411 of storing the portion of the data in an internal register of the flash memory device. It is noted that the flash memory device can perform another operation that will facilitate the transmission of the portion to the external controller.

Stage 411 is followed by stage 421 of reading, by the external controller, the portion of the data.

Stage 421 is followed by stage 425 of initiating the copy-back before completing stage 431 of evaluating a copy-back criterion (a reliability criterion).

Method 500 illustrates stage 425 as preceding stage 431 but both stages can be initiated in parallel.

Stage 431 may include evaluating the reliability of the portion of the data—the number of errors that are expected to be included in the data either before the copy-back or when such a copy-back is completed.

If the reliability criterion is fulfilled, stage 431 is followed by stage 441 of performing a copy-back. Stage 441 may include issuing a copy-back or programming the portion of the logical data already present in the internal register.

If the reliability criterion fails, stage 431 is followed by stage 451 of reading the entire data (if it was not already read during stage 421) from the flash memory device and fixing the data by applying error correction decoding to provide amended data. Stage 451 also includes sending the amended data to the flash memory device.

Stage 451 may include reading the data from the flash memory device using optimized read thresholds, and additionally or alternatively using soft decoding Stage 451 is followed by stage 461 of programming the amended data to the flash memory device.

Stage 461 may be followed by stage 491 of stopping the copy-back that was initiated during stage 425 and marking the copied-back data that was already copied-back as irrelevant. A block or physical page of the flash memory device that was programmed by the stopped copy-back is marked as invalid.

FIG. 6 illustrates a method 600 according to an embodiment of the invention.

Method 600 includes checking the copy-back criterion by the flash memory device itself—by an evaluation circuit that belongs to the flash memory device. In that case, when the flash memory device determines that the reliability check fails, the external controller receives an error status and that initiates a reading of the page, a repair of the page by error correction coding and writing the amended page to the flash memory device.

Method 600 starts by stage 610 of receiving, by the flash memory device, a copy-back command. The copy-back command can be received by an (internal) controller of the flash memory device. Stage 610 can include initiating the copy-back in another manner. For example, the internal controller of the flash memory device can initiate the copy-back process.

Stage 610 is followed by stage 620 of storing data (such as any desired data to be copied-back) in an internal register of the flash memory device.

Stage 620 is followed by stage 630 of evaluating, by an internal evaluation circuit, the copy-back criterion. This may include evaluating a reliability of the data—the number of errors that are expected to be included in the data either before the copy-back or when such a copy-back is completed.

If the reliability criterion is fulfilled, stage 630 is followed by stage 640 of performing a copy-back. Stage 630 may include sending a copy-back success status indicator to the external controller.

If the reliability criterion is not fulfilled than stage 630 is followed by stage 650 of informing the external controller that the copy-back should not be executed. This can include sending a fail status indicator.

Stage 650 is followed by stage 660 of providing the data to the external memory controller. FIG. 6 illustrates stage 660 as including reading the data in an optimal manner (using optimized thresholds) and sending this data to the external controller. The optimized thresholds can be obtained by using a threshold training process.

Stage 660 is followed by stage 670 of decoding the data by applying an error correction decoding scheme to provide amended data.

Stage 670 is followed by stage 680 of writing the amended data to the flash memory device.

FIG. 7 illustrates a method 700 according to an embodiment of the invention.

Method 700 differs from method 600 of FIG. 6 by including stages 730, 740 and 795.

Method 700 includes checking the copy-back criterion by the flash memory device itself—by an evaluation circuit that belongs to the flash memory device. In that case, when the flash memory device determines that the reliability check fails, the external controller receives an error status and that initiates a reading of the page, a repair of the page by error correction coding and writing the amended page to the flash memory device.

Method 700 starts by stage 710 of receiving, by the flash memory device, a copy-back command. The copy-back command can be received by an (internal) controller of the flash memory device. Stage 710 can include initiating the copy-back in another manner. For example, the internal controller of the flash memory device can initiate the copy-back process.

Stage 710 is followed by stage 720 of storing data (such as any desired data to be copied-back) in an internal register of the flash memory device. It is noted that the flash memory device can perform another operation that will facilitate the transmission of the portion to the external controller.

Stage 720 is followed by stage 730 of reading, by the external controller, the portion of the data.

Stage 730 is followed by stage 740 of initiating the copy-back before completing (or even before initiating) stage 750 of evaluating a copy-back criterion (a reliability criterion) by an internal evaluation circuit.

FIG. 7 illustrates stages 730, 740 and 750 as being executed in a sequential manner but these stages can be initiated in parallel.

If the reliability criterion is fulfilled, stage 750 is followed by stage 755 of completing the copy-back. Stage 755 may include sending a copy-back success status indicator to the external controller.

If the reliability criterion is not fulfilled than stage 750 is followed by stage 760 of informing the external controller that the copy-back should not be executed. This can include sending a fail status indicator.

Stage 760 is followed by stage 770 of providing the data to the external memory controller. FIG. 7 illustrates stage 770 as including reading the data in an optimal manner (using optimized thresholds) and sending this data to the external controller. The optimized thresholds can be obtained by using a threshold training process.

Stage 770 is followed by stage 780 of decoding the data by applying an error correction decoding scheme to provide amended data.

Stage 780 is followed by stage 790 of writing the amended data to the flash memory device.

Stage 790 is followed by stage 795 of stopping the copy-back that was initiated during stage 740 and marking the copied-back data that was already copied-back as irrelevant. A block or physical page of the flash memory device that was programmed to by the stopped copy-back is marked as invalid.

Each of the above-described methods or stages can be executed by a computer (such as but not limited to a host computer, a memory controller and the like) that reads instructions that are stored in a non-transitory computer readable medium.

Figure 8:
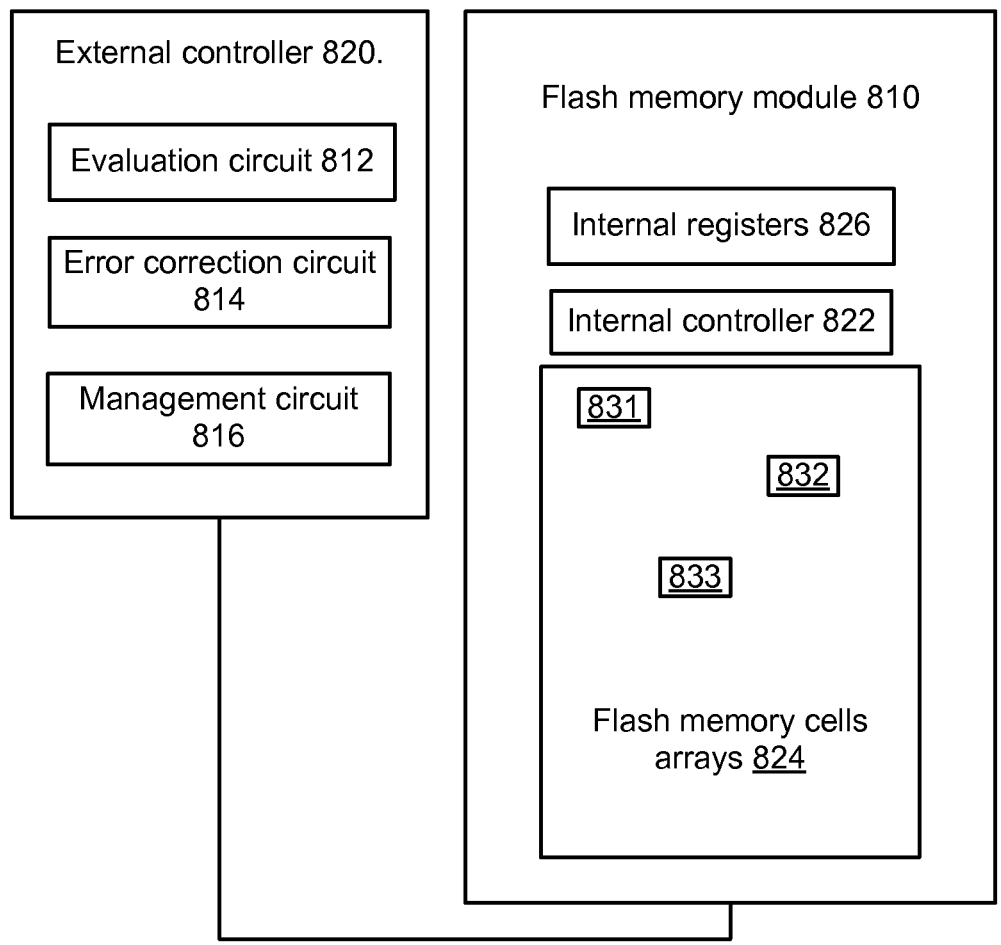
FIGS. 8-9 illustrate systems according to various embodiments of the invention.

FIG. 8 illustrates system 800 according to an embodiment of the invention.

System 800 includes a flash memory device 810 and an external controller (external controller) 820. The external controller 820 is not a part of the flash memory device 810 but is connected to the flash memory device 810.

The external controller 820 includes an evaluation circuit 812 that is arranged to receive at least a portion of data that is destined to be copied-back and to determine whether the data should be copied-back or should be error corrected.

The external controller 82 may also include an error correction circuit 814 that is arranged to error correct the data to provide amended data if the evaluation circuit 812 determines that the data should be error corrected.

The flash memory device 810 includes flash memory cell arrays 824, internal registers 826 and an internal controller 822 that is arranged to copy-back the data to a flash memory device, if the evaluation circuit 812 determines that the data should be copied-back. The internal controller 822 is arranged to copy the data within the flash memory device 820.

The flash memory cell arrays can be grouped to pages, erase blocks and the like. Data is written to, read from and copy-back between source flash memory cells and destination flash memory cells.

The amended data can be programmed to the flash memory device by a programming process that can be controlled by the internal controller 822, the external controller 820 or both.

The internal controller 822 or the external controller 820 may be arranged to initialize a copy-back of the data to the flash memory device 810 before a completion of the determining step by the evaluation circuit 812; to complete the copy-back if the determination by the evaluation circuit 812 indicates that the data should be copied-back; and stop the copy-back of the data to the flash memory device 810 if the determination by the evaluation circuit 812 indicates that the data should be error corrected.

The external controller 820 can include a management circuit 816 that is arranged to prioritize a wear-level operation of a destination block of the flash memory device that stores the copied-back data.

The management circuit 816 can be arranged to schedule an execution of a copy-back based on at least one parameter of a program erase cycle count of a destination block that stores the copied-back data, a time of execution of the copy-back of the data to the destination block, and an estimation of a reliability of data that was copied-back to the destination block.

The evaluation circuit 812 may be arranged to determine whether the data should be copied-back or should be error corrected, based on a reliability criterion that is responsive to a load imposed on the flash memory device.

The management circuit 816 can be arranged to erase an original version of the data if the determination by the evaluation circuit indicates that the data should be copied-back.

FIG. 8 also illustrates three sets of flash memory cells: a source set of memory cells 831, a destination set of flash memory cells 832 and an additional set of flash memory cells 833. A copy-back can include copying-back data stored in the source set of memory cells 831 to the destination set of flash memory cells 832.

Such a copy-back can be initiated before the evaluation of the copy-back criterion is completed. If the evaluation determines that the copy-back should be stopped then the destination set of flash memory cells 832 is defined as storing invalid data and amended data can be programmed to the additional set of flash memory cells 833.

Figure 9:
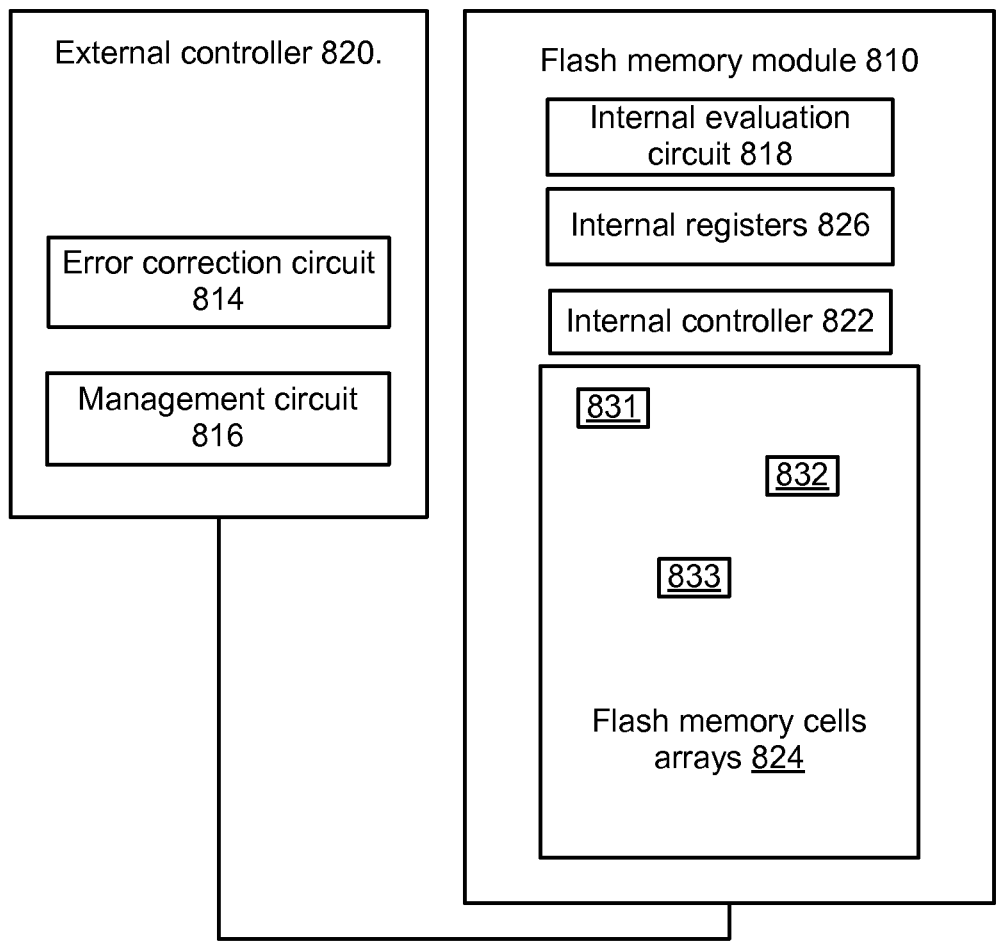

FIG. 9 illustrates system 900 according to an embodiment of the invention.

System 900 differs from system 800 of FIG. 8 by including an internal evaluation circuit 818 instead of the evaluation circuit 812 of the external controller 820.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

In the claims, the word "comprising" does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method for updating a flash memory device, the method comprising: transferring, from a flash memory device to an external controller, a portion of a data entity without transferring the data entity in its entirety; determining, by the external controller, based upon the portion of the data entity, whether to complete a copy back operation of the data entity or to correct errors of the data entity; if it is determined to correct errors of the data entity: completing a transfer of the data entity to the external controller; error correcting the data entity to provide an amended data entity; and writing the amended data entity to the flash memory device; wherein the completing of the transfer of the data entity to the external controller comprises reading the data entity using a second set of read thresholds that differs from a first set of read thresholds; if it is determined to complete the copy back operation: completing the copy back operation of the data entity by transferring the data entity within the flash memory device.

2. The method according to claim 1, further comprising initiating the copy back operation after a completion of the determining.

3. The method according to claim 1, wherein the transferring comprises transferring at least the portion of the data entity; and wherein the method further comprises initiating the copy back operation before completion of the determining.

4. The method according to claim 3, further comprising: completing a transfer of a fraction of the data entity to a first flash memory fraction before the completion of the determining; and declaring the first flash memory fraction as storing invalid data if it is determined to correct errors of the data entity.

5. The method according to claim 3, comprising: completing a transfer of a fraction of the data entity to a first flash memory fraction before the completion of the determining; and writing the amended data entity to a second flash memory fraction that differs from the first flash memory fraction.

6. The method according to claim 1, wherein the method comprises soft decoding the data entity by the external controller, if it is determined to correct errors of the data entity.

7. The method according to claim 1, wherein the determining comprises: decoding multiple sub-sets of the portion of the data entity by at least one error correction code to provide multiple results; and determining whether to complete the copy back operation or to correct errors of the data entity based on the multiple results.

8. The method according to claim 1, wherein the determining comprises applying an error detection code or an error correction code that differs from an error correction code applied by the external controller during the error correcting of the data entity.

9. The method according to claim 1, comprising transferring the data entity to a flash memory space within the flash memory device; and prioritizing the flash memory space for wear-leveling.

10. The method according to claim 1, wherein the data entity is stored at a flash memory space; and wherein the method comprises invoking the transferring and the determining based on at least one parameter of (a) a number of erase cycle that the flash memory space has undergone; (b) an age of the flash memory space; and (c) errors detected in reading attempts of similar flash memory spaces.

11. The method according to claim 1, wherein the determining is responsive to a load level of the flash memory device.

12. The method according to claim 1, wherein the portion of the data entity comprises redundancy bits that represent a number of copy back operations that were applied on the data entity after a last error correction operation was applied on the data entity; and wherein the determining is responsive to the number.

13. The method according to claim 12, comprising updating the number in response to the determining.

14. The method according to claim 12, comprising storing the redundancy bits within a register of the flash memory device; receiving from the external controller an updated value of the redundancy bits that reflects an update of the number; and programming the redundancy bits to a flash memory space.

15. A method for updating a flash memory device, the method comprising;
transferring, from a flash memory device to an external controller, a portion of a data entity;
determining, by the external controller, based upon the portion of the data entity, whether to complete a copy back operation of the data entity or to correct errors of the data entity;
if it is determined to correct errors of the data entity: completing a transfer of the data entity to the external controller; error correcting the data entity to provide an amended data entity; and writing the amended data entity to the flash memory device;
if it is determined to complete the copy back operation: completing the copy back operation of the data entity by transferring the data entity within the flash memory device;
wherein the determining comprises performing a modulo test of the portion of the data entity.

16. A system comprising: a flash memory device; and an external controller; wherein the external controller is arranged to: read a portion of a data entity from the flash memory device; determine, based upon the portion of the data entity, whether to complete a copy back operation of the data entity or to correct errors of the data entity; wherein if it is determined to correct errors of the data entity, the external controller is arranged to: complete a read operation of the data entity from the flash memory device; error correct the data entity to provide an amended data entity; and write the amended data entity to the flash memory device; otherwise, if it is determined to complete the copy back operation, the flash memory device is arranged to complete the copy back operation of the data entity by transferring the data entity within the flash memory device; wherein the external controller is arranged to determine whether to complete the copy back operation by performing a modulo test of the portion of the data entity.

17. A system comprising: a flash memory device; and an external controller; wherein the flash memory device is arranged to read a portion of a data entity using a first set of read thresholds; and transfer to the external controller, the portion of the data entity without transferring the data entity in its entirety; wherein the external controller is arranged to perform a determination, based upon the portion of the data entity, whether to complete a copy back operation of the data entity or to correct errors of the data entity; if it is determined to correct errors of the data entity then the flash memory device is arranged to reading the data entity using a second set of read thresholds that differs from the first set of read thresholds and complete a transfer of the data entity to the external controller; and wherein the external controller is arranged to error correct the data entity to provide an amended data entity; and write the amended data entity to the flash memory device; if it is determined to complete the copy back operation then the flash memory device is arranged to complete the copy back operation of the data entity by transferring the data entity within the flash memory device.

18. The system according to claim 17 wherein the flash memory device is arranged to initiate the copy back operation after a completion of the determination.

19. The system according to claim 17 wherein the flash memory device is arranged to initiate the copy back operation before completion of the determination.

20. The system according to claim 17 wherein the flash memory device is arranged to complete a transfer of a fraction of the data entity to a first flash memory fraction before a completion of the determination; and wherein the external controller is arranged to declare the first flash memory fraction as storing invalid data if it is determined to correct errors of the data entity.

21. The system according to claim 17 wherein the flash memory device is arranged to write the amended data entity to a second flash memory fraction that differs from the first flash memory fraction.

22. The system according to claim 17 wherein the external controller is arranged to soft decode the data entity if it is determined to correct errors of the data entity.

23. The system according to claim 17 wherein the external controller is arranged to decode multiple sub-sets of the portion of the data entity by at least one error correction code to provide multiple results; and determine whether to complete the copy back operation or to correct errors of the data entity based on the multiple results.

24. The system according to claim 17 wherein the external controller is arranged to apply an error detection code or an error correction code that differs from an error correction code applied by the external controller during the error correcting of the data entity.

25. The system according to claim 17 wherein the flash memory device is arranged to transfer the data entity to a flash memory space within the flash memory device; and prioritize the flash memory space for wear-leveling.

26. The system according to claim 17, wherein the data entity is stored at a flash memory space; and wherein the external controller is arranged to invoke the transfer of the portion of the data unit and the determination based on at least one parameter of (a) a number of erase cycle that the flash memory space has undergone; (b) an age of the flash memory space; and (c) errors detected in reading attempts of similar flash memory spaces.

27. The system according to claim 17, wherein the determination is responsive to a load level of the flash memory device.

28. The system according to claim 17, wherein the portion of the data entity comprises redundancy bits that represent a number of copy back operations that were applied on the data entity after a last error correction operation was applied on the data entity; and wherein the determination is responsive to the number.

29. The system according to claim 28, wherein the external controller is arranged to update the number in response to the determination.

30. The system according to claim 28, wherein the flash memory device is arranged to store the redundancy bits within a register of the flash memory device; receive from the external controller an updated value of the redundancy bits that reflects an update of the number; and program the redundancy bits to a flash memory space.

* * * * *